United States Patent
Huang et al.

(10) Patent No.: US 7,267,555 B2
(45) Date of Patent: Sep. 11, 2007

(54) ELECTRICAL CONNECTORS BETWEEN ELECTRONIC DEVICES

(75) Inventors: Hsin-Kai Huang, Minsyong Township, Chiayi County (TW); Kuei-Sheng Tseng, Bade (TW); Chu-Yu Liu, Jhubei (TW)

(73) Assignee: AU Optronics Corporation, Hsinchu (TW)

( * ) Notice: Subject to any disclaimer, the term of this patent is extended or adjusted under 35 U.S.C. 154(b) by 109 days.

(21) Appl. No.: 11/274,834

(22) Filed: Nov. 14, 2005

(65) Prior Publication Data

US 2007/0085963 A1 Apr. 19, 2007

(51) Int. Cl.
*H01R 12/00* (2006.01)
(52) U.S. Cl. ............................................. 439/74
(58) Field of Classification Search .................. 439/74
See application file for complete search history.

(56) References Cited

U.S. PATENT DOCUMENTS

| | | | |
|---|---|---|---|
| 4,094,566 A * | 6/1978 | Dola et al. ................. | 439/405 |
| 5,499,131 A | 3/1996 | Kim ............................ | 359/88 |
| 5,757,450 A | 5/1998 | Fujii et al. .................. | 349/106 |
| 6,104,465 A | 8/2000 | Na et al. .................... | 349/152 |
| 6,801,289 B2 | 10/2004 | Ichioka et al. ............. | 349/152 |
| 6,806,939 B2 | 10/2004 | Fujita et al. ................ | 349/152 |
| 2004/0239863 A1 | 12/2004 | Liou et al. .................. | 349/152 |

* cited by examiner

*Primary Examiner*—Briggitte R. Hammond
(74) *Attorney, Agent, or Firm*—Ware, Fressola, Van Der Sluys & Adolphson LLP

(57) ABSTRACT

A fan-out pattern having two or more fan-out sections is implemented between a driver IC and a display for reducing or eliminating the pathlength differences among the electrical conductors in the fan-out pattern. As such, some of the conductors between the driver IC and the display can have two or more zigzag swath widths. In a fan-out pattern having two fan-out sections, a first fan-out section widens the spacing, $S_I$, between two adjacent conductors at the IC side to an intermediate spacing, $S_M$, and a second fan-out section further widens the intermediate spacing $S_M$ to the spacing, $S_P$, at the display side. With two fan-out sections, the first zigzag extension is implemented in some conductors between the IC side and the first fan-out section, and the second zigzag extension is implemented in some conductors between the first fan-out section and the second fan-out section.

22 Claims, 8 Drawing Sheets

ELECTRICAL CONNECTORS BETWEEN ELECTRONIC DEVICES

FIELD OF THE INVENTION

The present invention relates generally to a set of electrical connectors between two electronic devices and, more particularly, to the electrical connectors between a drive IC and the pixel area of a display panel.

BACKGROUND OF THE INVENTION

A display panel, such as a liquid crystal display (LCD) panel comprises a pixel area, a plurality of data lines and gate lines connected to the pixel area. These data lines and gate lines are connected to a plurality of integrated circuit drivers, or driver ICs, as shown in FIG. 1. Each of the driver IC typically has a bond pad area having a plurality of electrically conductive pads (not shown) to allow a plurality of electrical conductors to be connected to the connectors at the pixel area, as shown in FIG. 2. Because the spacing, $S_I$, between adjacent conductors at the IC side is much smaller than the spacing, $S_P$, between adjacent connectors at the pixel area, a fan-out pattern is used to spread out the conductors from the IC side to the pixel area. In this fan-out pattern, the side conductors are always longer than the conductors in the middle portion of the pattern. For example, conductor A is shorter than conductor B, which is shorter than conductor C, and so on. If the conductors are made of the same material and have substantially the same thickness and width, then a longer conductor has more electrical resistance than a shorter one.

In order to reduce the differences in electrical resistance among the conductors in a fan-out pattern, different zigzag path patterns are used for the conductors in the middle portion, as shown in FIG. 3. In particular, Na et al. (U.S. Pat. No. 6,104,465) discloses a fan-out connector pattern having a straight portion and a serpentine portion, wherein the conductors in the straight portion is made of a different material from the conductors in the serpentine portion. Moreover, the conductors in the serpentine portions may have many different serpentine shapes, such as wavelike shapes and ridged shapes.

Kim (U.S. Pat. No. 5,499,131) discloses a fan-out pattern wherein each conductor has a narrow conductor portion connected to a wide conductor portion. By adjusting the length of the wide conductor portion, the electrical resistance can be reduced or increased so as to reduce the resistance differences among the conductors. Fujii et al. (U.S. Pat. No. 5,757,450) discloses a fan-out pattern wherein each conductor has a narrow conductor portion, a wide conductor portion and an inclined conductor portion having an intermediate width located between the narrow conductor portion and wide conductor portion.

When the number of data/gate lines to be driven by a driver IC is very large, it may not be feasible to vary the conductor width or to adjust the length to the wide conductor portion in order to reduce the resistance differences among the conductors in a fan-out pattern. Thus, it would be advantageous to use different zigzag paths in a fan-out pattern to reduce the resistance differences. As shown in FIG. 3, a zigzag path allows the pathlength of a conductor to be extended on both sides of a straight line. The extension is represented by a swath width in FIG. 3. For example, conductor A has a swath width $W_A$ due to the zigzag path extension, conductor B has swath width $W_B$, conductors C, D and E have swath widths $W_C$, $W_D$ and $W_E$, respectively.

In general, the pathlength of a zigzag path increases with the swath width. Thus, in order to reduce the resistance differences among the conductors, the zigzag swath width in the middle conductors is greater than the zigzag swath width in the side conductors in the fan-out pattern. As shown in FIG. 3, $W_A$ is greater than $W_C$, which is greater than $W_D$ and $W_E$. As such, the pathlength differences in the conductors can be reduced or substantially eliminated. However, as the number of conductor connecting a driver IC to a display area grows, the zigzag paths in a fan-out pattern having one fan-out section such as the pattern shown in FIG. 3 may not be sufficient to reduce the resistance differences effectively.

It is thus advantageous and desirable to provide a different fan-out pattern in order to increase the range of a zigzag pathlength.

SUMMARY OF THE INVENTION

The present invention uses a fan-out pattern having two or more fan-out sections in order to reduce or eliminate the pathlength differences among the electrical conductors in the fan-out pattern. As such, a conductor between the driver IC and the pixel area can have two or more zigzag swath widths. In a fan-out pattern having two fan-out sections, for example, a first fan-out section widens the spacing, $S_I$, between two adjacent conductors at the IC side to an intermediate spacing, $S_M$, and a second fan-out section further widens the intermediate spacing $S_M$ to the spacing, $S_P$, at the pixel area side. With two fan-out sections, the first zigzag extension is implemented in some of the conductors between the IC side and the first fan-out section, and the second zigzag extension is implemented in some of the conductors between the first fan-out section and the second fan-out section. In general, the zigzag swath width in the second zigzag extension is greater than the zigzag swath width in the first zigzag extension.

The present invention can also be extended such that the fan-out pattern has one or more fan-out sections implemented between the second fan-out section and the pixel area.

DETAILED DESCRIPTION OF THE INVENTION

Figure 1:
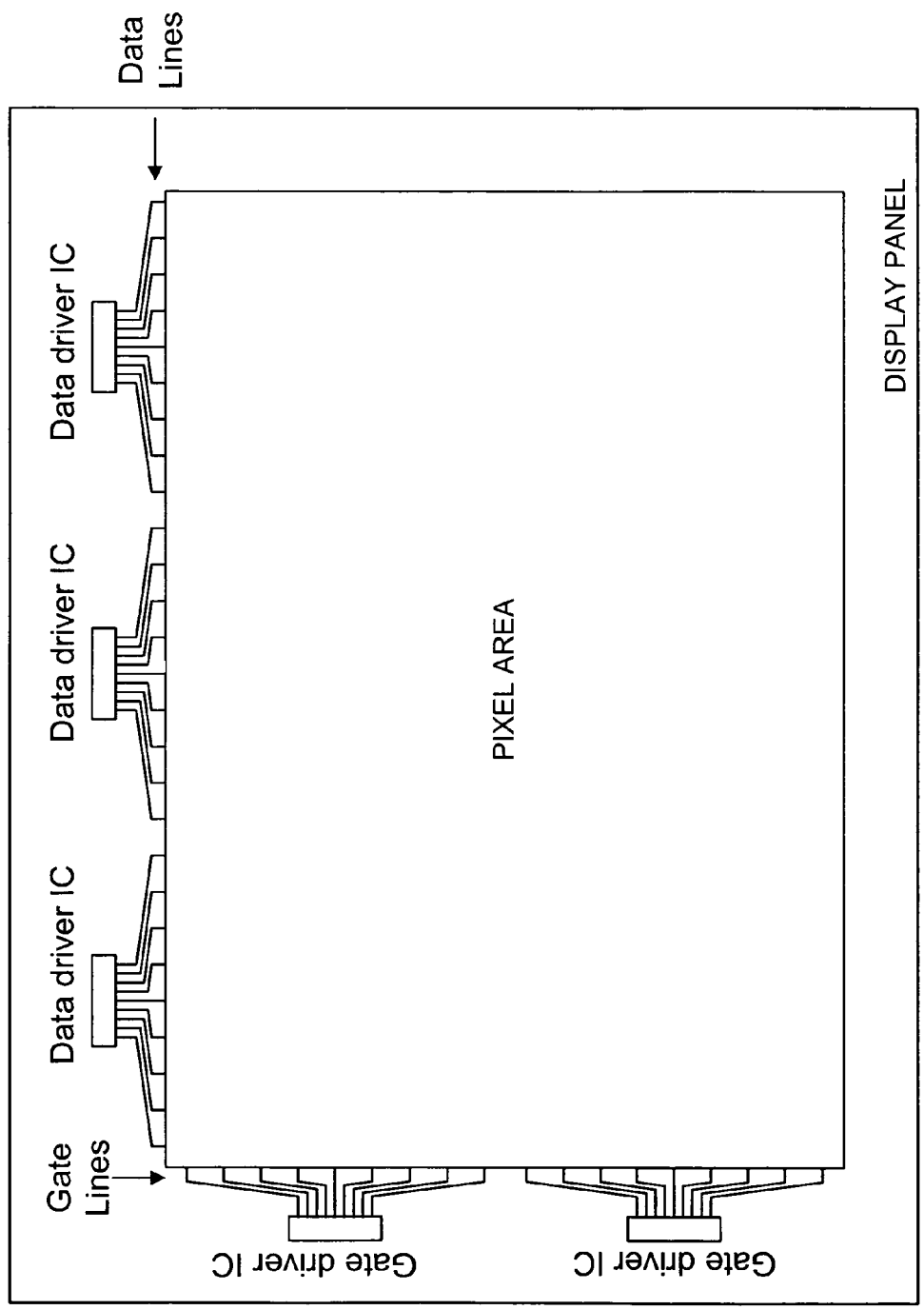
FIG. 1 is a schematic representation showing a plurality of data driver ICs and gate driver ICs electrically connected to the data and gate lines of a pixel area in a prior art display panel.
Figure 2:
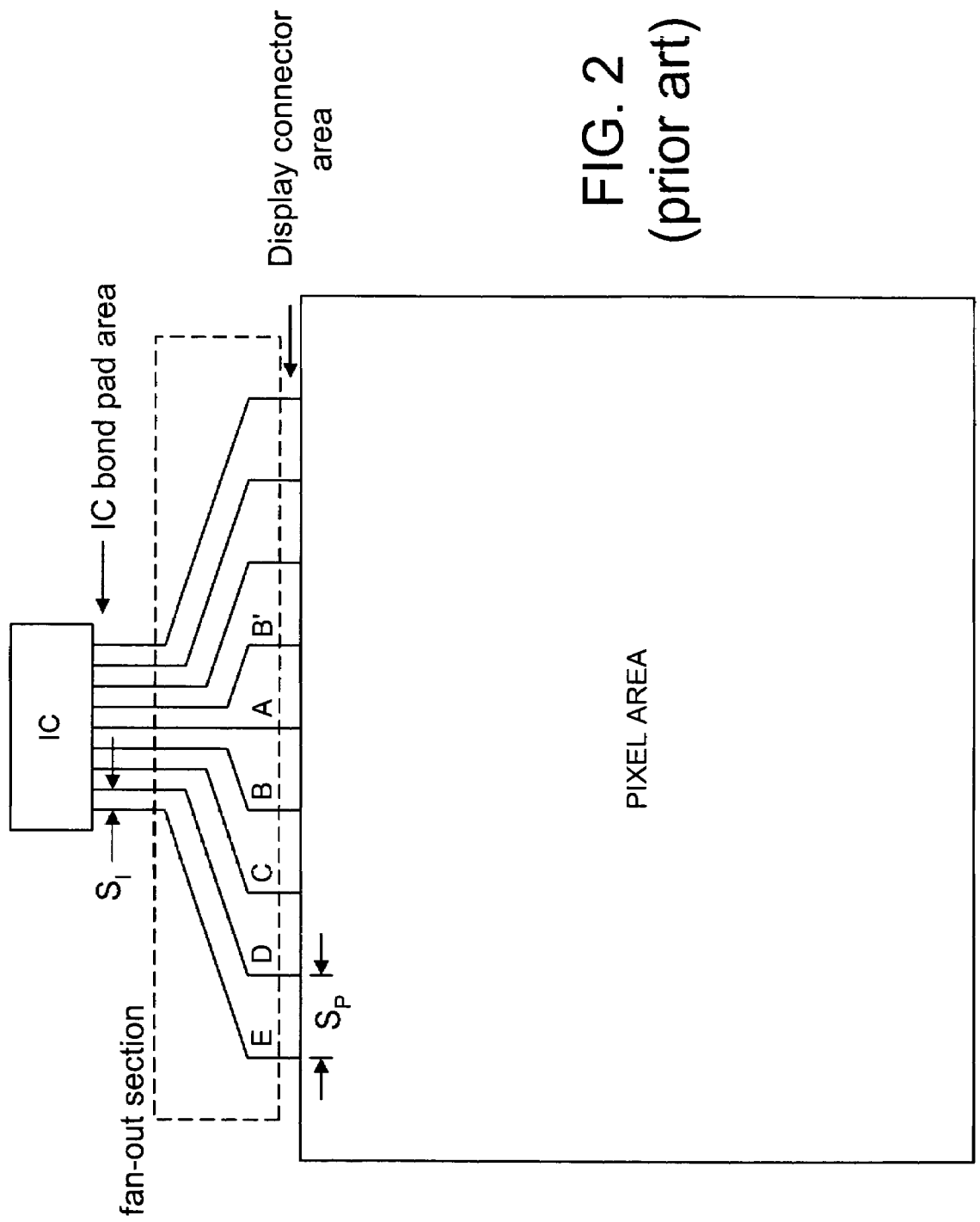
FIG. 2 is a schematic representation showing a prior art fan-out pattern for use in the electrical conductors connecting the bond pad area of a driver IC and at least a section of the pixel area.
Figure 3:
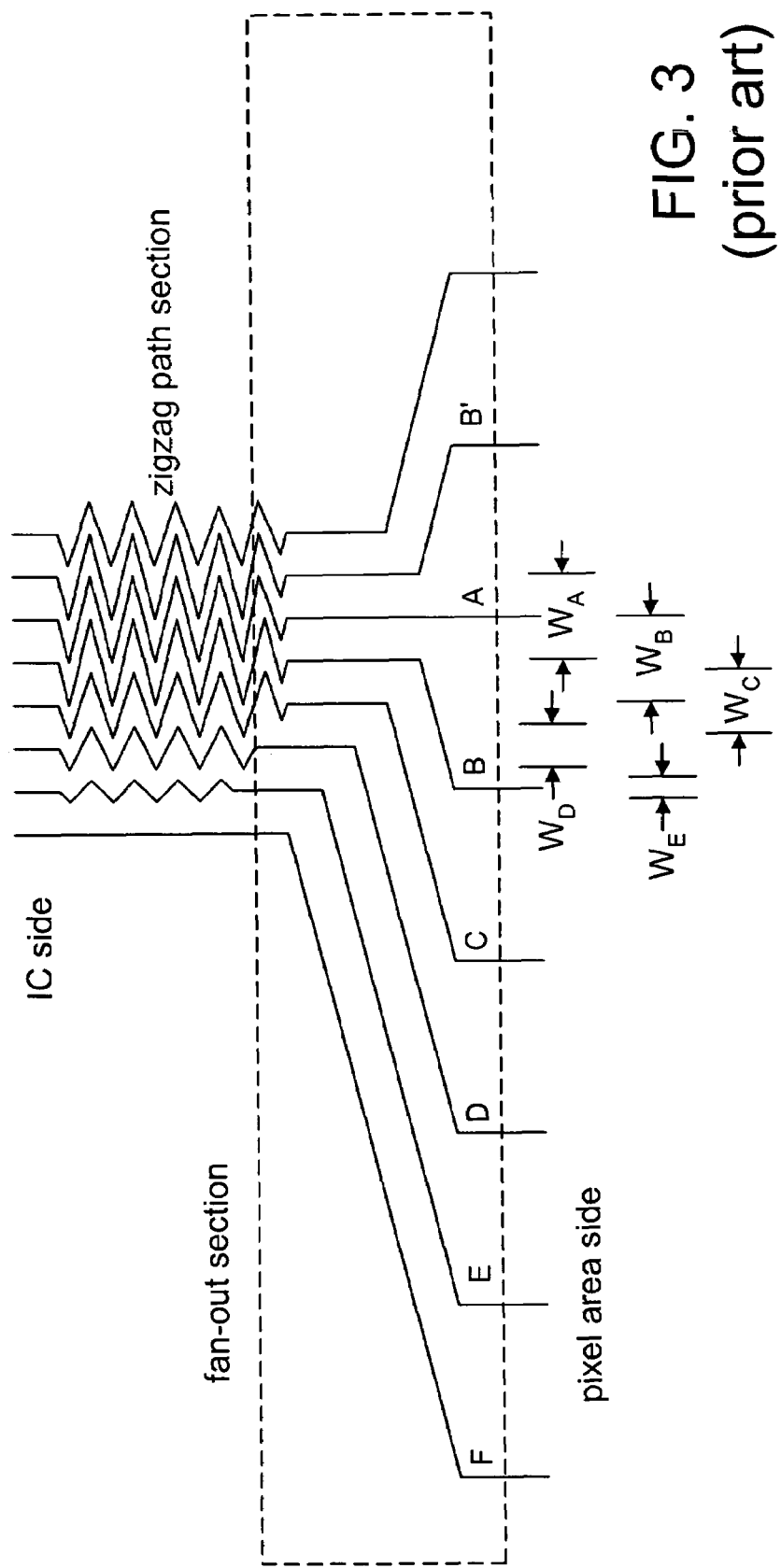
FIG. 3 is a schematic representation showing a typical zigzag pathlength extension in a prior art fan-out pattern.
Figure 4:
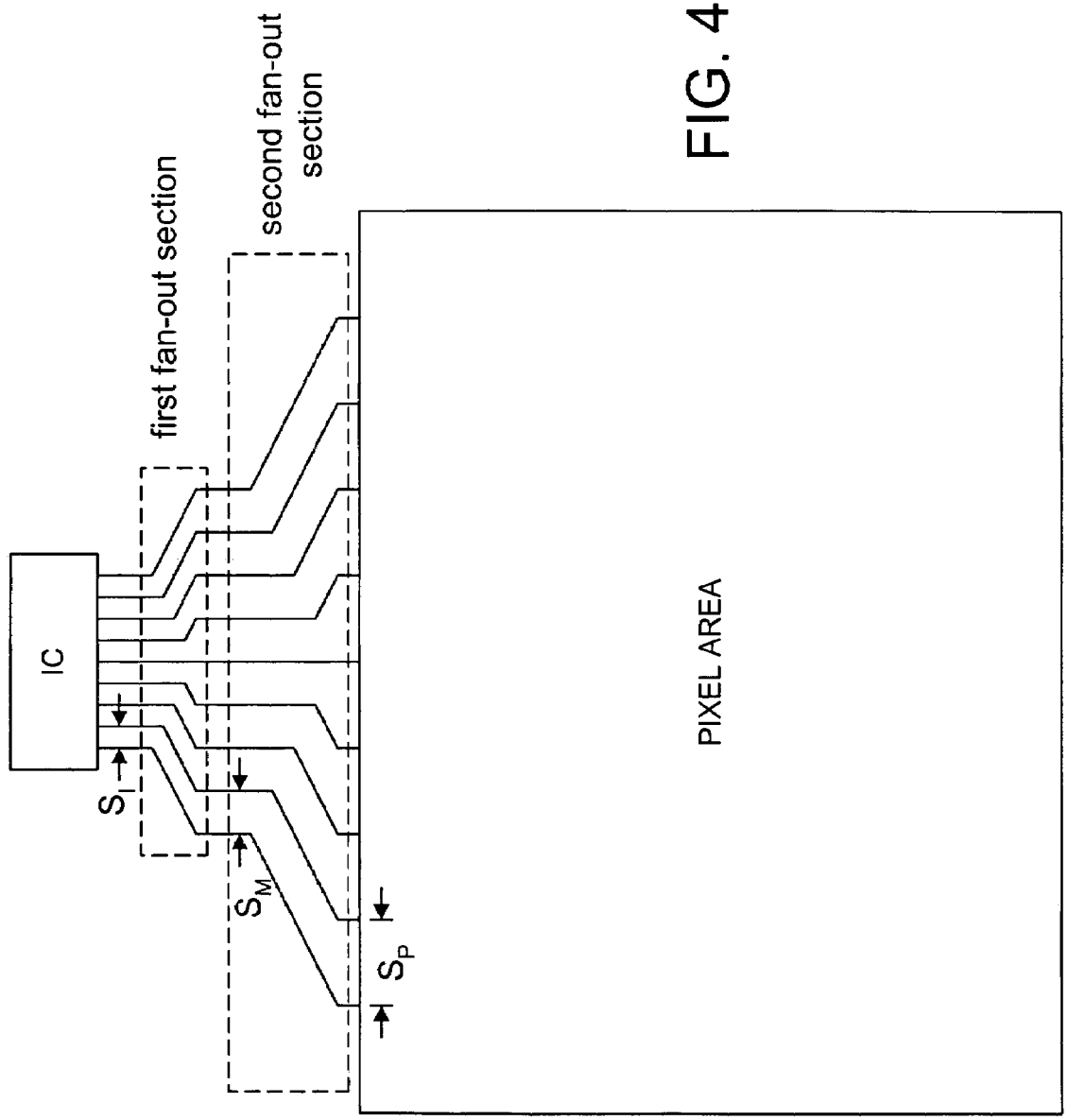
FIG. 4 is a schematic representation showing the fan-out pattern for use in the electrical conductors connecting the bond pad area of a driver IC and at least a section of the pixel area, according to an embodiment of the present invention.
Figure 5:
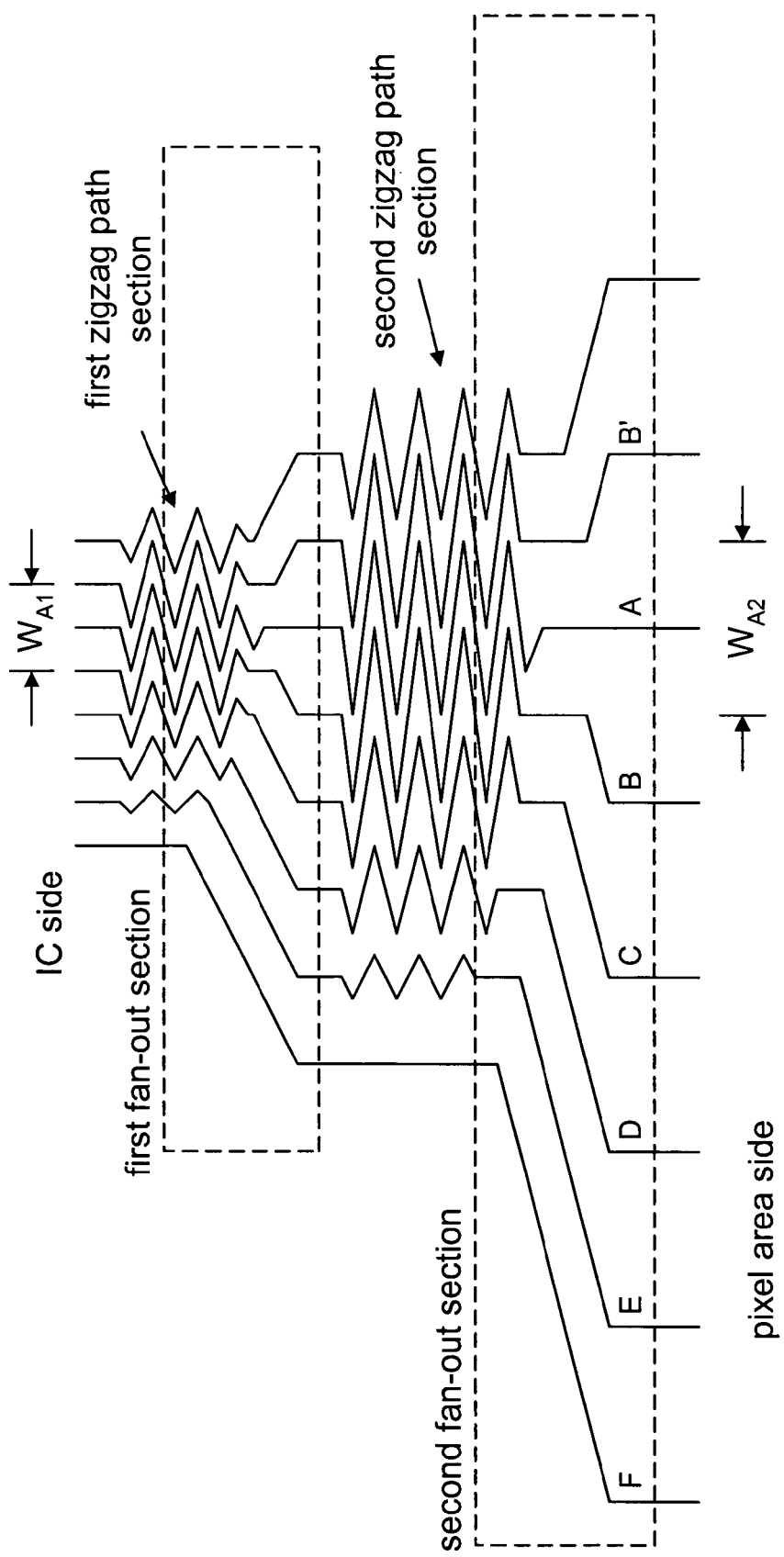
FIG. 5 is a schematic representation showing a zigzag pathlength extension in a fan-out pattern, according to an embodiment of the present invention.

The present invention uses a plurality of electrical conductors arranged in a fan-out pattern to provide electrical connections between an integrated circuit (driver IC) and the pixel area of a display panel. In particular, the fan-out pattern, according to the present invention, has two or more fan-out sections to widen the spacing between adjacent conductors in two or more stages. As shown in FIG. 4, the first fan-out section widens the spacing $S_I$ between adjacent conductors at the IC side to an intermediate spacing $S_M$ and the second fan-out section widens the intermediate spacing $S_M$ to the spacing $S_P$ at the pixel area side. With two-stage spacing widening, the zigzag paths can be implemented in at least two sections. As shown in FIG. 5, the first zigzag path section is approximately located between the IC side and the first fan-out section, and the second zigzag path section is approximately located between the first fan-out section and the second fan-out section. In general, the zigzag swath width in the first zigzag path section is smaller than zigzag swath width of the same conductor in the second zigzag path section. For example, the zigzag path swath, $W_{A1}$, for conductor A in the first zigzag path section is smaller than the zigzag path swath, $W_{A2}$, in the second zigzag path section. Thus, when it is desirable to reduce the electrical resistance difference between conductor A and conductor F, for example, using both swaths, $W_{A1}$ and $W_{A2}$ to increase the pathlength of conductor A is more efficient than using one swath $W_{A1}$ alone.

Figure 6:
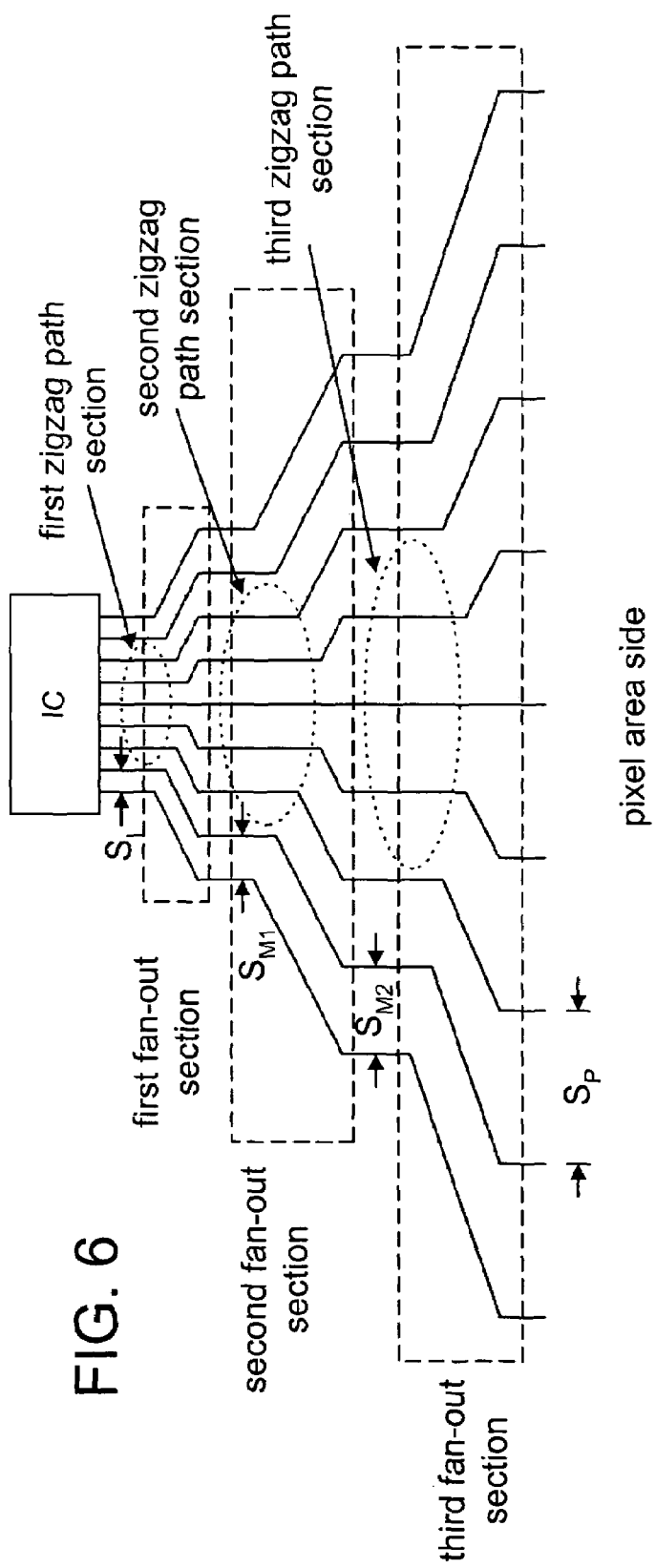
FIG. 6 is a s schematic representation showing a fan-out pattern, according to another embodiment of the present invention.

Depending on the difference between the conductor spacing $S_I$ at the IC side and the conductor spacing $S_P$ at the pixel area side, and depending on the distance between the IC and the pixel area, it may be desirable to have more than two fan-out sections so that more than two zigzag path sections can be implemented. For example, it may be possible to have three fan-out sections to widen the conductor spacing in three stages, as shown in FIG. 6. As shown, the first fan-out section widens the conductor spacing $S_I$ at the IC side to a first intermediate spacing $S_{M1}$, and the second fan-out section widens the first intermediate spacing $S_{M1}$ to a second intermediate spacing $S_{M2}$. The third fan-out section is then used to widen the spacing $S_{M2}$ to the spacing $S_P$ at the pixel area side. With this three-stage spacing widening, zigzag paths can be implemented in at least three sections. As shown in FIG. 6, the first zigzag path section is approximately located between the IC side and the first fan-out section, the second zigzag path section is approximately located between the first fan-out section and the second fan-out section, and the third zigzag path section is approximately located between the second fan-out section and the third fan-out section. In general, the zigzag swath width in the first zigzag path section is smaller than zigzag swath width of the same conductor in the second zigzag path section, and the zigzag swath width in the second zigzag path section is smaller than zigzag swath width of the same conductor in the third zigzag path section.

Figure 7:
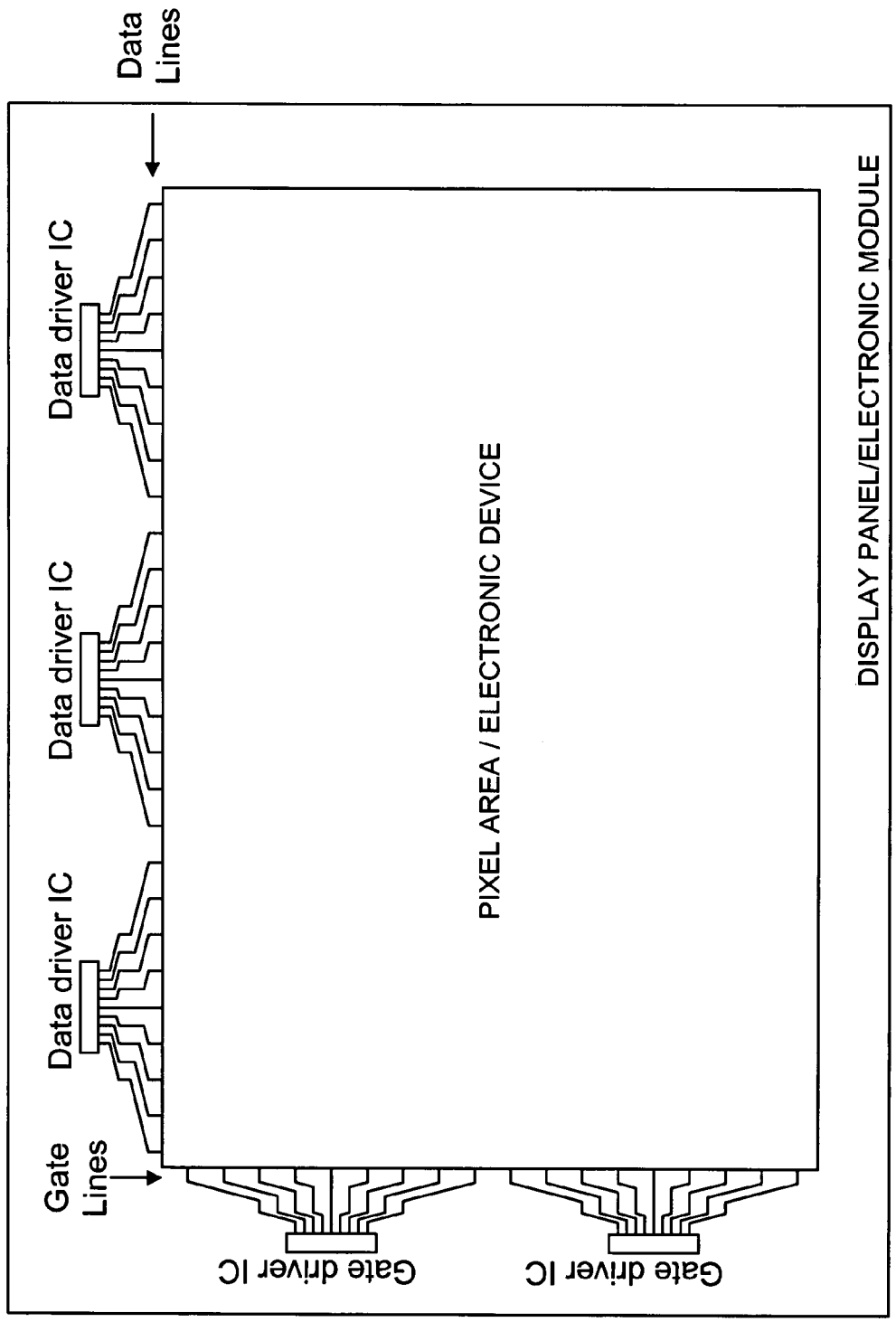
FIG. 7 is a schematic representation showing a display panel having a plurality of driver ICs electrically connected to a pixel area by a plurality of electrical conductors arranged in a fan-out pattern, according to the present invention.

In sum, in a display panel according to the present invention, a plurality of drivers ICs are electrically connected to the pixel area. The electrical conductors that are used to electrically connect the driver ICs to the pixel area are arranged in one or more fan-out patterns. At least one of the fan-out patterns has at least two fan-out sections. For example, the electrical conductors connecting each driver IC to a section of the pixel area can be arranged in a fan-out pattern having two fan-out sections, as shown in FIG. 7. Accordingly, two zigzag path sections can be implemented in each fan-out pattern, as shown in FIG. 5.

Figure 8B:
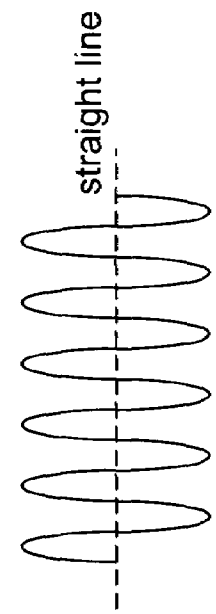
FIG. 8B is a schematic representation showing another zigzag pattern.
Figure 8A:
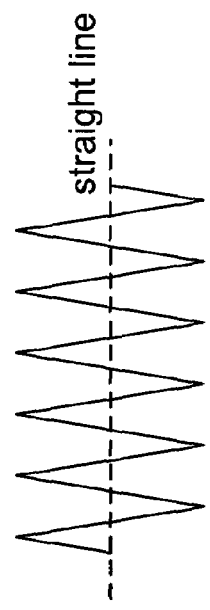
FIG. 8A is a schematic representation showing a zigzag path pattern.
Figure 9:
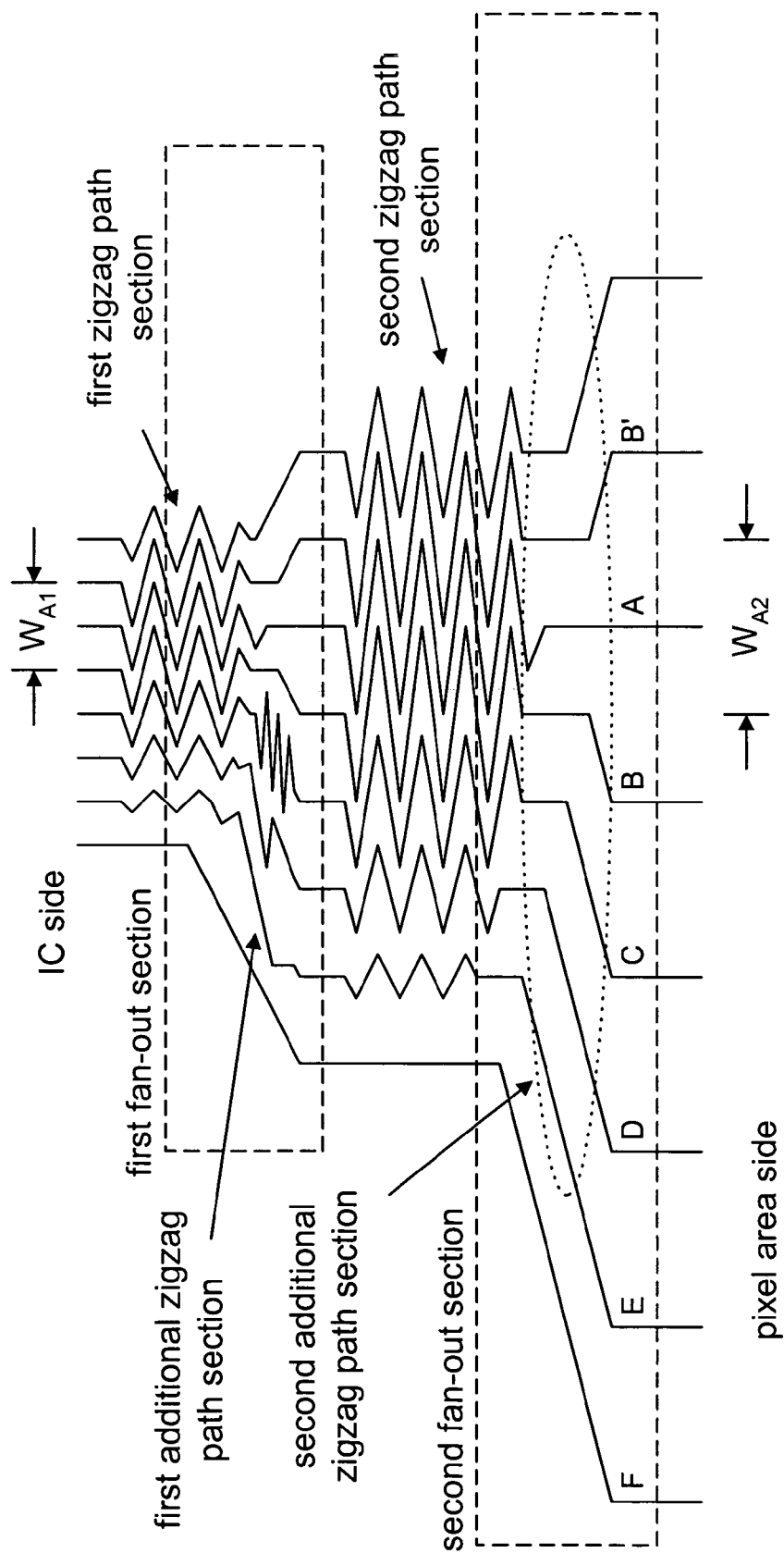
FIG. 9 is a schematic representation showing one or more additional zigzag patterns in the fan-out sections.

It should be noted that the zigzag path pattern as shown in FIG. 5 is for illustration purposes only. In general, a zigzag path pattern allows a conductor to follow a winding course extending on both sides of a straight line in order to increase the conductor pathlength. As such, the electrical resistance of the conductor can be increased accordingly. The winding course may contain connecting straight-line segments as shown in FIG. 8A. The winding course may be a wavelike pattern as shown in FIG. 8B. The winding course may have a repeating pattern as shown in FIGS. 8A and 8B, but it can be irregular. Furthermore, some of the conductors can be wider than the other conductors. For example, a section of conductor F or conductor E near the pixel area side can be made wider than the same conductor near the IC side in order to reduce the electrical resistance in the conductor. Moreover, it is also possible to increase the conductor pathlength by implementing an addition zigzag pattern in one or more fan-out sections. As shown in FIG. 9, it is possible to implement a first additional zigzag path section in the first fan-out section. It is also possible to implement a second additional zigzag path section in the second fan-out section.

The present invention has been disclosed as a method to reduce the pathlength differences between the conductors arranged in a fan-out pattern for electrically connecting a driver IC to at least a section of the pixel area of a display panel. It should be appreciated by a person skilled in the art that the present invention is also applicable to the electrical conductors arranged in a fan-out pattern for electrically connecting two electronic modules or devices.

Thus, although the invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for use in an electrical connection between a first electronic device and a second electronic device, the first electronic device comprising a plurality of first electrical connection terminals with a first spacing between adjacent terminals, the second electronic device comprising a plurality of second electrical connection terminals with a second spacing between adjacent terminals greater than the first spacing, wherein the electrical connection comprises a plurality of electrical conductors arranged in a connection pattern for allowing each conductor to connect a first electrical connection terminal to a corresponding second electrical connection terminal, the connection pattern having a first end near the first electronic device, a second end near the second electronic device, two side areas between the first and second ends, and a middle area between the side areas, said method comprising the steps of:

spreading the electrical conductors outwardly in a first fan-out section near the first end of the connection pattern in order to increase the spacing between adjacent conductors to a third spacing greater than the first spacing;

extending the electrical conductors toward the second end in an intermediate section of the connection pattern; and spreading the electrical conductors from the intermediate section outwardly in a second fan-out section toward the second end of the connection pattern in order to further increase the spacing between adjacent conductors to a fourth spacing greater than the third spacing, wherein at least some of the electrical conductors in the middle section of the connection pattern are provided in a winding pattern at least between the first fan-out section and the second fan-out section in order to increase the length of said at least some electrical conductors.

2. The method of claim 1, wherein the fourth spacing is substantially equal to the second spacing.

3. The method of claim 1, wherein at least some of the electrical conductors in the middle section of the connection pattern are provided in a further winding pattern near the first end of the connection pattern.

4. The method of claim 1, wherein at least part of the winding pattern is located in the first fan-out section.

5. The method of claim 3, wherein at least part of the further winding pattern is located in the second fan-out section.

6. The method of claim 1, further comprising the steps of:

extending the electrical conductors in the second fan-out section further toward the second end in another intermediate section of the connection pattern between the second fan-out section and the second end of the connection pattern; and spreading the electrical conductors from the other intermediate section outwardly in a third fan-out section toward the second end of the connection pattern in order to further increase the spacing between adjacent conductors to a fifth spacing greater than the fourth spacing.

7. The method of claim 6, further comprising the step of providing a further winding pattern on at least some of the electrical conductors in the middle section of the connection pattern at least between the second fan-out section and the third fan-out section in order to further increase the length of said at least some electrical conductors.

8. The method of claim 7, wherein the fifth spacing is substantially equal to the second spacing.

9. The method of claim 1, wherein at least some of the electrical conductors in the middle section of the connection pattern are also provided in a further winding pattern in the first fan-out section.

10. The method of claim 1, wherein at least some of the electrical conductors in the middle section of the connection pattern are also provided in a further winding pattern in the second fan-out section.

11. An electrical connector for use in providing an electrical connection between a first electronic device and a second electronic device, the first electronic device comprising a plurality of first electrical connection terminals with a first spacing between adjacent terminals, the second electronic device comprising a plurality of second electrical connection terminals with a second spacing between adjacent terminals greater than the first spacing, said electrical connector comprising:

a plurality of electrical conductors arranged in a connection pattern for allowing each conductor to connect a first electrical connection terminal to a corresponding second electrical connection terminal, the connection pattern having a first end near the first electronic device, a second end near the second electronic device, two side areas between the first and second ends, and a middle area between the side areas, wherein the connection pattern comprises a first fan-out section near the first end, wherein the electrical conductors are spread outwardly in the first fan-out section in order to increase the spacing between adjacent conductors to a third spacing greater than the first spacing;

an intermediate section between the first fan-out section and the second end, wherein the electrical conductors in the first fan-out section are extended toward the second end; and a second fan-out section between the intermediate section and the second end, wherein the electrical conductors are spread outwardly in order to further increase the spacing between adjacent conductors to a fourth spacing greater than the third spacing, wherein at least some of the electrical conductors in the middle section of the connection pattern are provided in a winding pattern at least between the first fan-out section and the second fan-out section in order to increase the length of said at least some electrical conductors.

12. The electrical connector of claim 11, wherein the fourth spacing is substantially equal to the second spacing.

13. The electrical connector of claim 11, wherein at least some of the electrical conductors in the middle section of the connection pattern are provided in a further winding pattern near the first end of the connection pattern.

14. The electrical connector of claim 11, wherein at least part of the winding pattern is located in the first fan-out section.

15. The electrical connector of claim 13, wherein at least part of the further winding pattern is located in the second fan-out section.

16. The electrical connector of claim 11, further comprising:

a second intermediate section between the second fan-out section and the second end, wherein the electrical connectors in the first second fan-out section are extended toward the second end; and a third fan-out section between the second intermediate section and the second end, wherein the electrical conductors are spread outwardly in order to further increase the spacing between adjacent conductors to a fifth spacing greater than the fourth spacing, wherein at least some of the electrical conductors in the middle section of the connection pattern are provided in a further winding pattern at least between the second fan-out section and the third fan-out section in order to further increase the length of said at least some electrical conductors.

17. The electrical connector of claim 16, wherein the fifth spacing is substantially equal to the second spacing.

18. An electronic module comprising:

a first electronic device having a plurality of first electrical connection terminals, the first electrical connection terminals having a first spacing between adjacent terminals;

a second electronic device having a plurality of second electrical connection terminals, the second electrical connection terminal having a second spacing between adjacent terminals, the second spacing greater than the first spacing; and an electrical connector for use to provide an electrical connection between a first electronic device and a second electronic device, the electrical connector comprising:

a plurality of electrical conductors arranged in a connection pattern for allowing each conductor to connect a first electrical connection terminal to a corresponding second electrical connection terminal, the connection pattern having a first end near the first electronic device, a second end near the second electronic device, two side areas between the first and second ends, and a middle area between the side areas, wherein the connection pattern comprises a first fan-out section near the first end, wherein the electrical conductors are spread outwardly in the first fan-out section in order to increase the spacing between adjacent conductors to a third spacing greater than the first spacing;

an intermediate section between the first fan-out section and the second end, wherein the electrical conductors in the first fan-out section are extended toward the second end; and a second fan-out section between the intermediate section and the second end, wherein the electrical conductors are spread outwardly in order to further increase the spacing between adjacent conductors to a fourth spacing greater than the third spacing, wherein at least some of the electrical conductors in the middle section of the connection pattern are provided in a winding pattern at least between the first fan-out section and a second fan-out section in order to increase the length of said at least some electrical conductors.

19. The electronic module of claim 18, wherein the fourth spacing is substantially equal to the second spacing.

20. The electronic module of claim 18, wherein at least some of the electrical conductors in the middle section of the connection pattern are provided in a further winding pattern near the first end of the connection pattern.

21. The electronic module of claim 18, wherein at least part of the winding pattern is located in the first fan-out section.

22. The electrical module of claim 20, wherein at least part of the further winding pattern is located in the second fan-out section.

* * * * *

UNITED STATES PATENT AND TRADEMARK OFFICE
CERTIFICATE OF CORRECTION

| | | |
|---|---|---|
| PATENT NO. | : 7,267,555 B2 | Page 1 of 1 |
| APPLICATION NO. | : 11/274834 | |
| DATED | : November 14, 2005 | |
| INVENTOR(S) | : Huang et al. | |

It is certified that error appears in the above-identified patent and that said Letters Patent is hereby corrected as shown below:

In column 2, line 63, "s" should be deleted.

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,267,555 B2 | Page 1 of 1 |
| APPLICATION NO. | : 11/274834 | |
| DATED | : September 11, 2007 | |
| INVENTOR(S) | : Huang et al. | |

It is certified that error appears in the above-identified patent and that said Letters Patent is hereby corrected as shown below:

In column 2, line 63, "s" should be deleted.

This certificate supersedes the Certificate of Correction issued July 22, 2008.

Signed and Sealed this

Twelfth Day of August, 2008

JON W. DUDAS
*Director of the United States Patent and Trademark Office*